(12) United States Patent
Beasley et al.

(10) Patent No.: US 7,227,549 B2
(45) Date of Patent: Jun. 5, 2007

(54) INDICATING AND MANIPULATING A ZOOM REGION OF A WAVEFORM

(75) Inventors: Robert L. Beasley, Aloha, OR (US); Robert D. Twete, Beaverton, OR (US); Michael J. Wadzita, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/768,567

(22) Filed: Jan. 29, 2004

(65) Prior Publication Data
US 2004/0183818 A1    Sep. 23, 2004

(51) Int. Cl.
G06T 11/20 (2006.01)
G09G 5/00 (2006.01)

(52) U.S. Cl. .............. 345/440.1; 345/441; 345/660
(58) Field of Classification Search ........ 345/440–441, 345/660–661, 668
See application file for complete search history.

(56) References Cited

U.S. PATENT DOCUMENTS

| | | | |
|---|---|---|---|
| 4,755,811 A * | 7/1988 | Slavin et al. .............. 345/668 |
| 5,434,954 A * | 7/1995 | Kawauchi et al. .......... 345/440 |
| 5,579,463 A * | 11/1996 | Takano et al. .............. 345/440 |
| 5,617,523 A * | 4/1997 | Imazu et al. ................ 345/440 |
| 6,201,384 B1 * | 3/2001 | Alexander .............. 324/121 R |
| 6,466,006 B2 * | 10/2002 | Alexander .............. 324/121 R |
| 6,642,936 B1 * | 11/2003 | Engholm et al. .......... 345/661 |
| 6,734,857 B2 * | 5/2004 | Loughner, II ............ 345/440.1 |
| 6,917,889 B2 * | 7/2005 | Ward et al. .................. 702/67 |
| 2004/0054296 A1 * | 3/2004 | Ramseth ..................... 600/509 |

* cited by examiner

*Primary Examiner*—Kee M. Tung
*Assistant Examiner*—Jin-Cheng Wang
(74) *Attorney, Agent, or Firm*—Francis I. Gray; Thomas F. Lenihan

(57) ABSTRACT

A method of indicating and manipulating a zoom region of a waveform being displayed includes a zoom region indicator. The zoom region indicator has an associated marker that spans the zoom region but is never less than a minimum span to allow ease of identifying or locating the zoom region on the displayed waveform. Manipulating the associated marker with a pointer device causes the zoom region to move accordingly along the displayed waveform. The portion of the displayed waveform that is within the zoom region is displayed as a zoomed waveform on the display.

2 Claims, 2 Drawing Sheets

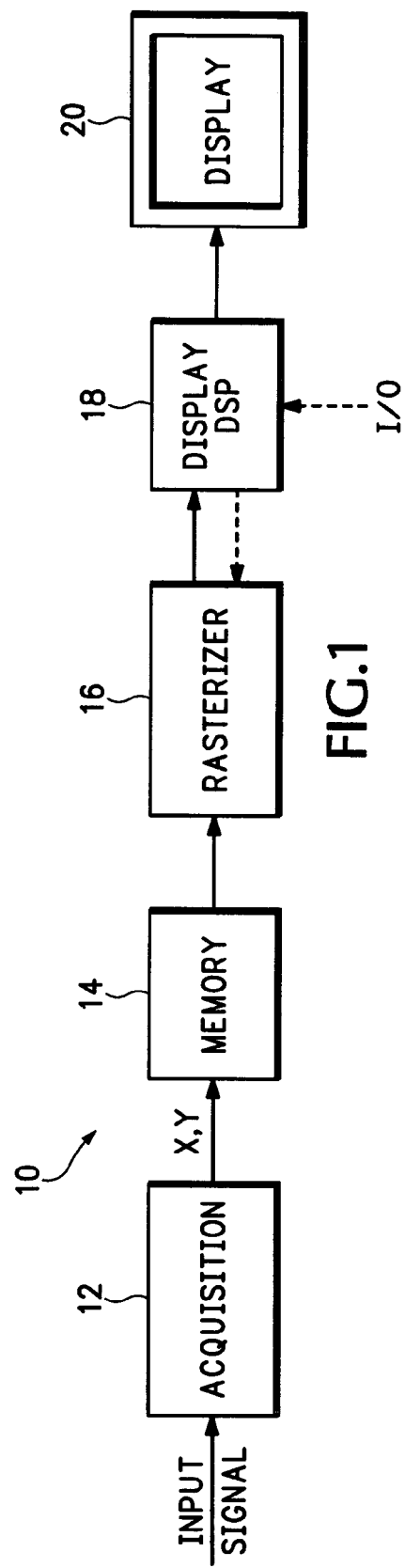
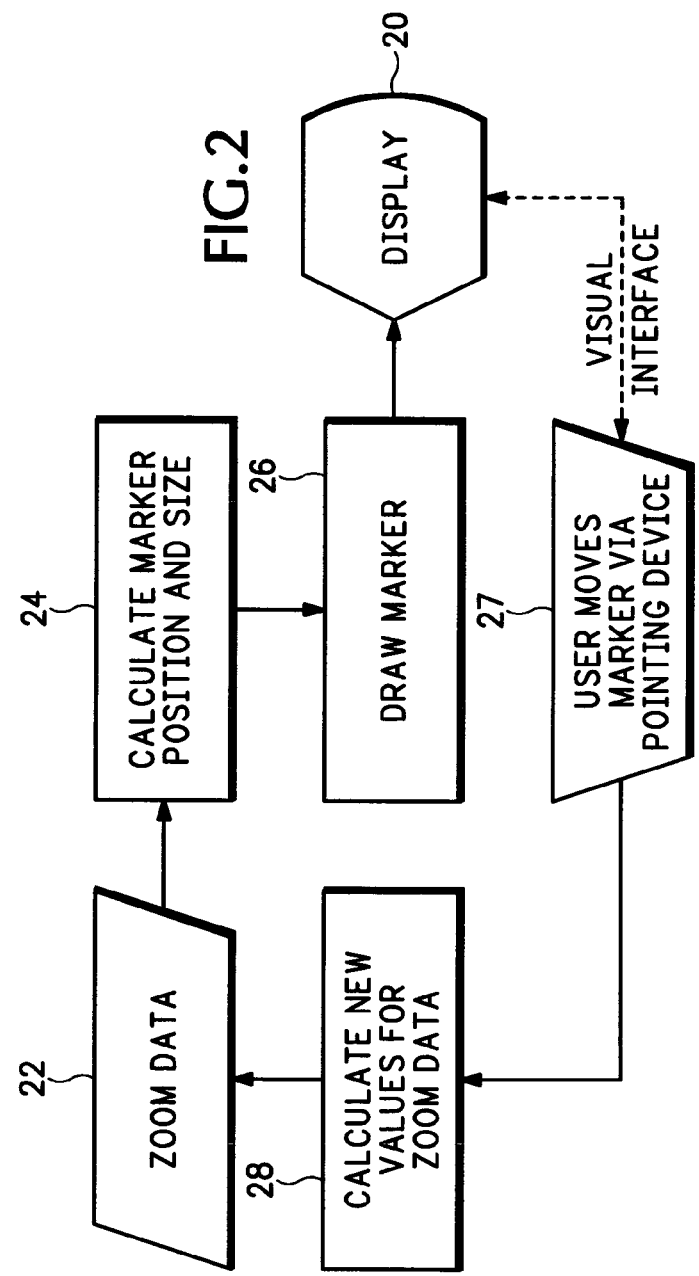

INDICATING AND MANIPULATING A ZOOM REGION OF A WAVEFORM

BACKGROUND OF THE INVENTION

The present invention relates to waveform displays on a measurement instrument, and more particularly to a method of easily indicating and manipulating a zoom region of a waveform on a display.

When zooming on waveforms in a measurement instrument with large zoom scale factors, it is often difficult to identify which region of a displayed waveform is being zoomed. Also when the zoom scale factors become extremely large, manipulation of zoom regions becomes very difficult as the indication of the zoom region on the displayed waveform becomes very small. When multiple regions of the displayed waveform are zoomed simultaneously, the difficulty of identifying and manipulating the unique zoom regions is compounded.

In order to look at particular portions of a long data record representing the displayed waveform acquired by the measurement instrument, such as a digital storage oscilloscope, in order to see details about the displayed waveform, regions within the long data record are selected by a zoom function. These zoom regions of the displayed waveform have previously been indicated by drawing a zoom box with the displayed waveform represented by the long data record, or by displaying the zoom regions as different colors within the displayed waveform, also referred to as shading. When the zoom region for the displayed waveform becomes smaller than two or three pixels on a display, i.e., appear essentially as a very narrow vertical line that may be lost in the displayed waveform, these regions are difficult to quickly identify and very difficult to manipulate except via conventional knobs.

Zoom regions also have been indicated via a summary view that uses a single line representing the displayed waveform with paired square brackets on the line to indicate which portion of the displayed waveform is being displayed on a zoomed waveform view. Vertical bars and a dashed line represent the displayed waveform and the square brackets indicate on the dashed line the region of the displayed waveform currently being displayed in the zoomed waveform view.

Horizontal manipulation of the zoom region position is typically accomplished through the use of knobs. Use of knobs does not easily allow the zoom region to move in large increments in either direction, i.e., using knobs to move the zoom region to a different portion relatively distant from the original portion is slow.

What is desired is a method of easily indicating and manipulating a zoom region of a waveform being displayed.

BRIEF SUMMARY OF THE INVENTION

Accordingly the present invention provides a method of indicating and manipulating a zoom region of a waveform being displayed by displaying a zoom region indicator with the displayed waveform. The zoom region indicator has an associated marker that spans the zoom region but is never less than a minimum span to allow ease of identifying or locating the zoom region on the display. Manipulating the associated marker with a pointer device causes the zoom region to move accordingly along the displayed waveform. The portion of the displayed waveform that is within the zoom region is displayed as a zoomed waveform on the display.

The objects, advantages and other novel features are described by the following detailed description when read in conjunction with the appended claims and attached drawing.

BRIEF DESCRIPTION OF THE SEVERAL VIEWS OF THE DRAWING

FIG. 1 is a rough block diagram view of a typical measurement that uses the present invention.

FIG. 2 is a flow diagram view of display processing for the zoom indicating and manipulating method according to the present invention.

DETAILED DESCRIPTION OF THE INVENTION

Figure 3:
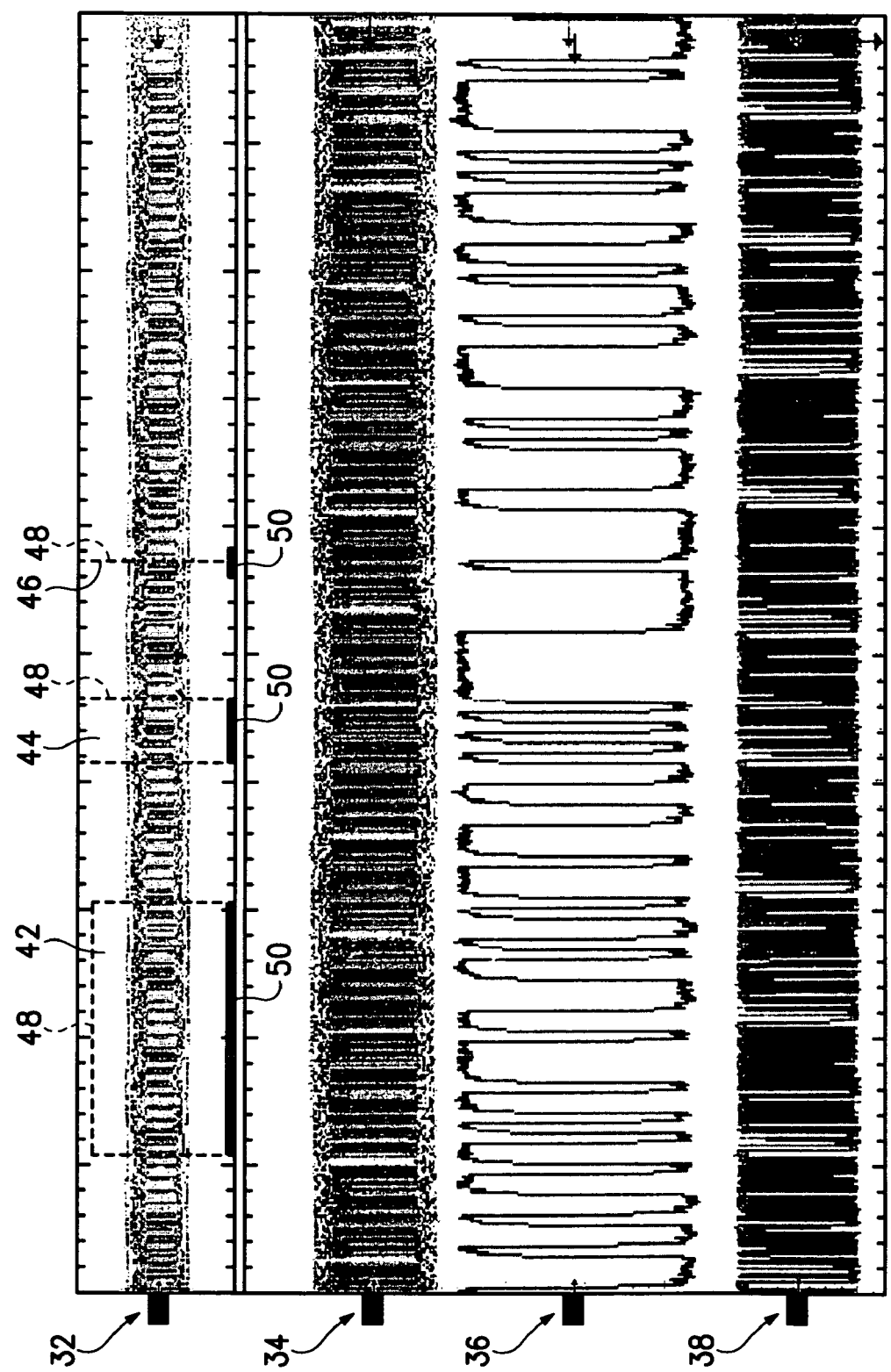
FIG. 3 is a plan view of a display showing the results of the zoom indicating and manipulating method according to the present invention.

Referring now to FIG. 1 a signal being examined is input to an acquisition module 12 of a measurement instrument 10, such as a digital storage oscilloscope, where it is converted into X (time) and Y (amplitude) values and stored in a memory 14 as a long data record. The X,Y values are then input to a rasterizer 16 for converting to a raster format for display. The raster format from the rasterizer 16 is input to a display digital signal processor (DSP) 18 to provide a display raster which is shown on a display device 20. In the display DSP 18 the portion of the long data record to be displayed is determined according to operator controls (I/O), the display DSP 18 in turn controlling the operation of the rasterizer 16 accordingly. The display DSP 18 adds to the waveform raster from the rasterizer 16 other graphics, alpha-numerics, etc. as is well-known in the art.

Within the display DSP 18 a zoom data module 22 has initial location and scale values that determine where and how much of the long data record is to be displayed as a zoomed waveform. Based upon the zoom data a zoom region indicator location and size is calculated by a first calculation module 24, and based upon the location and size a draw module 26 draws the zoom region indicator into the display raster encompassing the displayed waveform representing the long data record, from whence it is then provided on the display 20. The zoom region indicator may be a dotted rectangle as shown or some similar indicator and has an associated marker, as shown in FIG. 3. Where the zoom region indicator, due to the scale or size, is only a few pixels wide, the associated marker is maintained at a minimum size sufficient to enable it to be readily seen. A user viewing the display can, via a user interface 27, then select the zoom region indicated by the marker via a pointing device by clicking and dragging on the marker for rapidly moving the zoom region to a different portion of the displayed waveform. As the pointer moves, a second calculating module 28 calculates new location data for input to the zoom data module 22 and the zoom region indicator on the display 20 is updated accordingly. Also by pointing at the particular marker in the presence of multiple zoom regions, that region is then associated with appropriate control knobs for fine positioning as in the prior art and for changing the scale.

FIG. 3 shows a typical display 20 having multiple simultaneous waveform views 32, 34, 36, 38. The first waveform view 32 shows the waveform represented by the long data record with, in this example, three zoom regions 42, 44, 46 indicated. As shown each zoom region 42, 44, 46 has a dotted rectangular portion 48 and an associated marker 50. The marker 50 is generally the same length as the width of the rectangular portion 48. However for the third zoom region 46 the rectangular portion 48 is only a few pixels wide so it appears as a vertical dotted line. The marker 50, however, is not less than a minimum width that is sufficient to enable the user to readily point to it in order to select and manipulate the zoom region 46. This makes it easy to identify the zoom region 46 and manipulate it. The remaining waveform views 34, 36, 38 show the zoomed waveforms associated with the respective zoom regions 42, 44, 46, the color of the markers of the zoom regions being the same as the color of the zoomed waveform in the waveform views so the user can properly associate each zoomed waveform view with the corresponding zoom region. In this case view 34 is associated with region 42, view 36 is associated with region 46, and view 38 is associated with region 44.

Although the zoom region indicator described above is a rectangle, any means for identifying the zoom region within the waveform data record—shading, brackets, etc.—may be used so long as the associated marker spans the zoom region, is at least a minimum length or width, and is movable by an appropriate device to change the zoom region within the waveform data record.

Thus the present invention provides a method of locating and manipulating zoom regions in a displayed waveform represented by a long data record by defining a rectangular zoom region indicator with the displayed waveform that has a solid base or marker that is the same length as the width of the rectangular zoom region indicator, but never less than a minimum length, and by using a pointing device to select a marker representing the zoom region for manipulating the zoom region.

What is claimed is:

1. A method of indicating and manipulating a zoom region within a long data record comprising:

displaying the long data record as a displayed waveform;

in response to zoom data which defines a location and scale for the zoom region, displaying a zoom region indicator representing the zoom region with the displayed waveform, the zoom region indicator having a width and an independent associated marker which spans the width of the zoom region and has a length equal to or greater than the width of the zoom region, the length being greater than the width of the zoom region when the width is less than a specified dimension;

simultaneously displaying with the displayed waveform a portion of the displayed waveform defined by the zoom region as a zoomed waveform; and manipulating the zoom region by moving the associated marker along the displayed waveform with a pointer device to display other portions of the displayed waveform as the zoomed waveform.

2. The method as recited in claim 1 wherein the zoomed waveform displaying step comprises displaying the zoomed waveform in a different color from one used to display the displayed waveform with the zoom region indicator also being displayed in the different color.

* * * * *